United States Patent
Nallan et al.

(10) Patent No.: US 6,902,681 B2
(45) Date of Patent: Jun. 7, 2005

(54) METHOD FOR PLASMA ETCHING OF HIGH-K DIELECTRIC MATERIALS

(76) Inventors: Padmapani C. Nallan, 2200 Pettigrew Dr., San Jose, CA (US) 95148; Ajay Kumar, 510 Kenilworth Ct., Sunnyvale, CA (US) 90486

(*) Notice: Subject to any disclaimer, the term of this patent is extended or adjusted under 35 U.S.C. 154(b) by 269 days.

(21) Appl. No.: 10/184,301

(22) Filed: Jun. 26, 2002

(65) Prior Publication Data

US 2004/0002223 A1 Jan. 1, 2004

(51) Int. Cl.$^7$ .................................................. B44C 1/22
(52) U.S. Cl. ........................... 216/67; 216/6; 438/689; 134/1; 134/1.3
(58) Field of Search ...................... 216/6, 67; 438/689; 134/1, 1.3, 26

(56) References Cited

U.S. PATENT DOCUMENTS

| | | | |
|---|---|---|---|
| 5,071,714 A | 12/1991 | Rodbell et al. | 428/620 |
| 5,112,439 A * | 5/1992 | Reisman et al. | 216/37 |
| 5,188,979 A | 2/1993 | Filipiak | 437/192 |
| 5,337,207 A | 8/1994 | Jones et al. | 361/321.1 |
| 5,356,833 A | 10/1994 | Maniar et al. | 437/187 |
| 5,667,700 A * | 9/1997 | Rudigier et al. | 216/12 |
| 6,040,248 A * | 3/2000 | Chen et al. | 438/725 |
| 6,174,766 B1 * | 1/2001 | Hayashi et al. | 438/241 |
| 6,184,072 B1 | 2/2001 | Kaushik et al. | 438/197 |
| 6,204,141 B1 | 3/2001 | Lou | 438/386 |
| 6,270,568 B1 | 8/2001 | Droopad et al. | 117/4 |
| 6,271,115 B1 * | 8/2001 | Liu et al. | 438/618 |
| 6,297,095 B1 | 10/2001 | Muralidhar et al. | 438/257 |
| 6,300,202 B1 | 10/2001 | Hobbs et al. | 438/287 |
| 6,319,730 B1 | 11/2001 | Ramdani et al. | 438/3 |
| 6,326,261 B1 | 12/2001 | Tsang et al. | 438/243 |
| 6,348,386 B1 | 2/2002 | Gilmer | 438/288 |
| 6,368,517 B1 * | 4/2002 | Hwang et al. | 216/67 |
| 2001/0055852 A1 * | 12/2001 | Moise et al. | 438/396 |
| 2002/0072016 A1 * | 6/2002 | Chen et al. | 430/323 |
| 2003/0170986 A1 * | 9/2003 | Nallan et al. | 438/689 |
| 2004/0007561 A1 * | 1/2004 | Nallan et al. | 216/67 |

FOREIGN PATENT DOCUMENTS

| | | | | |
|---|---|---|---|---|
| JP | 2002-75972 | * | 3/2002 | |
| WO | 01/51072 | | 7/2001 | A61K/38/00 |
| WO | 01/97257 | | 12/2001 | |

OTHER PUBLICATIONS

Visokay, et al., "Application of HfSiON as a gate dielectric material," Applied Physic Letters, 80 (17), 3183–3185, 2002.

Yee, et al., "Reactive radio frequency sputter deposition of higher nitrides of titanium, zirconium and hafnium," J. Vac. Sci. Technol A 4(3) May/Jun. 1986, 381–387.

* cited by examiner

Primary Examiner—Shamim Ahmed
(74) Attorney, Agent, or Firm—Moser, Patterson, Sheridan LLP; Joseph Bach

(57) ABSTRACT

A method of etching high dielectric constant materials (a material with a dielectric constant greater than 4) using a halogen gas, reducing gas, and passivating gas chemistry. An embodiment of the method is accomplished using chlorine, carbon monoxide, and nitrogen to etch and passivate a hafnium dioxide layer.

12 Claims, 4 Drawing Sheets

METHOD FOR PLASMA ETCHING OF HIGH-K DIELECTRIC MATERIALS

BACKGROUND OF THE INVENTION

1. Field of Invention

The present invention relates generally to a method for plasma etching semiconductor wafers. More specifically, the invention relates to a method for etching high K dielectric materials using a gas mixture comprising a halogen gas, a reducing gas, and a passivating gas.

2. Description of the Background Art

The evolution of integrated circuit designs continually requires faster circuitry, greater circuit densities and necessitates a reduction in the dimensions of the integrated circuit components and use of materials that improve electrical performance of such components. A field effect transistor that is used in forming an integrated circuit generally utilizes a gate structure having a polysilicon electrode deposited upon a gate dielectric that separates the electrode from an underlying layer of doped silicon. The underlying layer of doped silicon comprises the channel, source, and drain regions of the transistor. The gate dielectric is typically fabricated from a silicon dioxide ($SiO_2$) layer and/or a layer or layers of materials having a high dielectric constant (high K) such as $Al_2O_3$, $ZrO_2$, barium strontium titanate (BST), lead zirconate titanate (PZT), $ZrSiO_2$, $HfSiO_2$, HfSiON, $TaO_2$, and the like.

Fabrication of the gate structure comprises plasma etching the high K gate dielectric and post-etch cleaning to remove etch residue. The high K dielectric is etched using a gas mixture comprising a halogen gas (such as chlorine) and a reducing gas (such as carbon-monoxide). The carbon from the reducing gas forms a residue that must be removed after etching is completed. Oxygen is present in the post-etch cleaning plasma that generally uses an oxygen plasma to remove the etch residue. During the cleaning process, oxygen diffuses into the silicon of the wafer and the polysilicon of the gate electrode. When the polysilicon electrode and underlying doped silicon layer are exposed to oxygen, the oxygen oxidizes them. Oxidation degrades electrical performance of the gate structure and the transistor. During the post-etch cleaning process, diffusion of oxygen leads to creation of silicon dioxide ($SiO_2$) formations in the polysilicon electrode and underlying doped silicon layer. Such formations may render the gate structure of a transistor defective or inoperable.

Therefore, there is a need in the art for a high K material etching process that protects the polysilicon electrode and underlying silicon from oxidation.

SUMMARY OF INVENTION

The disadvantages associated with the prior art are overcome by the present invention for etching materials with high dielectric constant such as $HfO_2$, $ZrO_2$, $Al_2O_3$, BST, PZT, $ZrSiO_2$, $HfSiO_2$, HfSiON, $TaO_2$, and the like using a gas mixture comprising a halogen gas, a reducing gas, and a passivating gas. In one embodiment of the invention, an etch gas (or mixture) comprising chlorine ($Cl_2$), carbon monoxide (CO), and nitrogen ($N_2$) is used for etching a hafnium dioxide film. In another embodiment, the passivation gas is used after etching is complete to passivate the exposed silicon.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAILED DESCRIPTION

Figure 1:
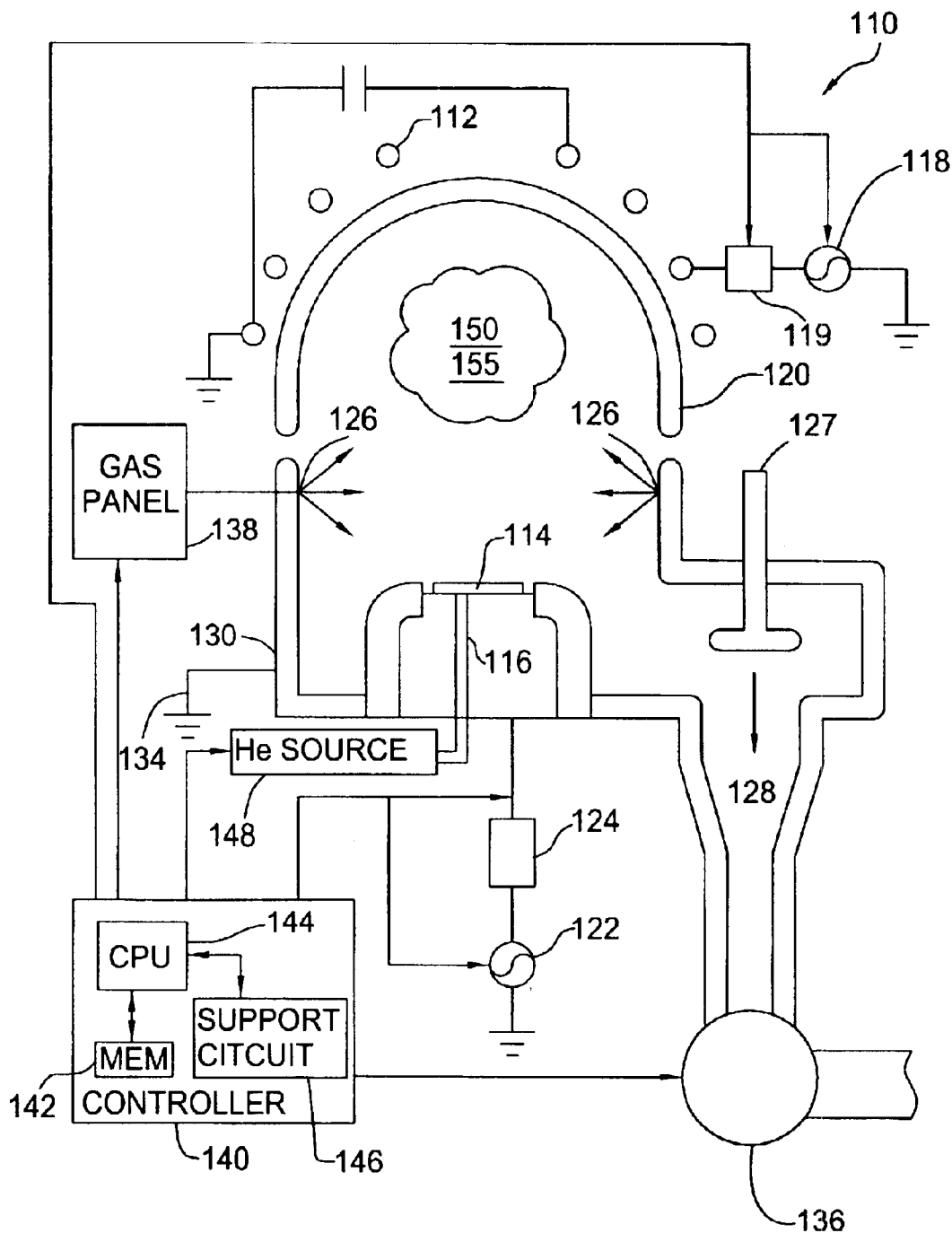
FIG. 1 depicts a schematic diagram of a plasma processing apparatus of the kind used in performing the etching processes according to one embodiment of the present invention.

The present invention is a method for etching materials with a high dielectric constant using a plasma generated from a gas (or gas mixture) comprising gases containing a halogen gas (such as chlorine ($Cl_2$), HCl, and the like) and a reducing gas (such as (CO)). A passivating gas (such as nitrogen ($N_2$)) may be added to the etchant plasma or may be added after etching to passivate any exposed silicon. Herein the high dielectric constant materials are referred to as high K materials and are the materials having a dielectric constant greater than 4.0. The high K materials include $HfO_2$, $ZrO_2$, $Al_2O_3$, barium strontium titanate (BST), lead zirconate titanate (PZT), $ZrSiO_2$, $HfSiO_2$, $TaO_2$, and the like. The exact stoichiometry of a high K material is not critical and may vary from the ratios given in the formula. The type of halogen gas and reducing gas are selected to best remove a metal and oxygen from a layer of the high K material, respectively, and the type of the passivating gas is selected to best protect the polysilicon electrode and underlying silicon from oxidation.

In one embodiment, the passivating gas comprises nitrogen. In a plasma, the passivating gas reacts with exposed silicon to form a passivation layer on the polysilicon electrode, the exposed sidewalls of the dielectric layer, and the silicon substrate. Such passivating layer blocks oxygen ($O_2$) from diffusing into the polysilicon electrode and into the underling doped silicon of the substrate. In one embodiment of the present invention, the passivating gas is nitrogen ($N_2$) that may be optionally mixed with one or several inert gases such as helium ($He_2$) and the like.

The etch process of present invention can be performed as either a one-step or two-step process. The one-step process etches a wafer using a plasma comprising the halogen gas, reducing gas, and passivating gas. During the one-step process, etching of an exposed portion of the high K dielectric layer and formation of the passivating layers are performed simultaneously. As the etchants remove the dielectric layer and expose the silicon of the wafer, the passivating gas passivates the silicon. The two-step process comprises an etch step and a passivating step. Either most of or the entire exposed portion of the high K dielectric layer is removed during the etch step. The etch step uses a plasma comprising the halogen gas and reducing gas. The passivating step passivates the gate structure and the exposed silicon of the substrate.

The one-step or two-step etch process of the present invention can be reduced to practice in a Decoupled Plasma Source (DPS) Centura® etch system or a DPS-II etch system available from Applied Materials, Inc. of Santa Clara, Calif. The DPS reactor uses an inductive plasma source to generate and sustain a high density plasma while a wafer can be biased by an independent source. The decoupled nature of the plasma source allows independent control of ion energy and ion density. The DPS reactor provides a wide process window over changes in source and bias power, pressure, and etch chemistry, and uses an endpoint system to determine an end of the etch process.

FIG. 1 depicts a schematic diagram of the DPS etch process chamber 110, that comprises at least one inductive coil antenna segment 112, positioned exterior to a dielectric, dome-shaped ceiling 120 (referred to herein as the dome 120). Other chambers may have other types of ceilings, e.g., a flat ceiling. The antenna segment 112 is coupled to a radio-frequency (RF) source 118 (that is generally capable of producing an RF signal having a tunable frequency of about 50 kHz and 13.56 MHz. The RF source 118 is coupled to the antenna 112 through a matching network 119. Process chamber 110 also includes a substrate support pedestal (cathode) 116 that is coupled to a source 122 that is generally capable of producing an RF signal having a frequency of approximately 13.56 MHz. The source 122 is coupled to the cathode 116 through a matching network 124. Optionally, the source 122 may be a DC or pulsed DC source. The chamber 110 also contains a conductive chamber wall 130 that is connected to an electrical ground 134. A controller 140 comprising a central processing unit (CPU) 144, a memory 142, and support circuits 146 for the CPU 144 is coupled to the various components of the DPS etch process chamber 110 to facilitate control of the etch process.

In operation, a semiconductor wafer (herein also referred to as substrate) 114 is placed on the substrate support pedestal 116 and gaseous components are supplied from a gas panel 138 to the process chamber 110 through entry ports 126 to form a gaseous mixture 150. The gaseous mixture 150 is ignited into a plasma 152 in the process chamber 110 by applying RF power from the RF sources 118 and 122 respectively to the antenna 112 and the cathode 116. The pressure within the interior of the etch chamber 110 is controlled using a throttle valve 127 situated between the chamber 110 and a vacuum pump 136. The temperature at the surface of the chamber walls 130 is controlled using liquid-containing conduits (not shown) that are located in the walls 130 of the chamber 110.

The temperature of the substrate 114 is controlled by stabilizing the temperature of the support pedestal 116 and flowing helium gas from source 148 to channels formed by the back of the substrate 114 and grooves (not shown) on the pedestal surface. The helium gas is used to facilitate heat transfer between the pedestal 116 and the substrate 114. During the etch process, the substrate 114 is heated by a resistive heater within the pedestal to a steady state temperature and the helium facilitates uniform heating of the substrate 114. Using thermal control of both the dome 120 and the pedestal 116, the substrate 114 is maintained at a temperature of between 100 and 500 degrees Celsius.

The RF power applied to the inductive coil antenna 112 has a frequency between 50 kHz and 13.56 MHz and has a power of 200 to 2500 Watts. The bias power applied to the pedestal 116 may be in a form of DC, pulsed DC, or RF and is between 0 and 300 Watts.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. Software routines that, when executed by the CPU 144, cause the reactor to perform a one-step etching process 200 (described with respect to FIG. 2) or a two-step etching process 300 (described with respect to FIG. 3) are generally stored in the memory 142. The software routines may also be stored and/or executed by a second CPU (not shown) that is remotely located from the hardware being controlled by the CPU 144.

The software routines are executed after the wafer 114 is positioned on the pedestal 116. The software routines, when executed by the CPU 144, transform the general purpose computer into a specific purpose computer (controller) 140 that controls the chamber operation such that the etching processes 200 and 300 are performed. Although the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Figure 2:
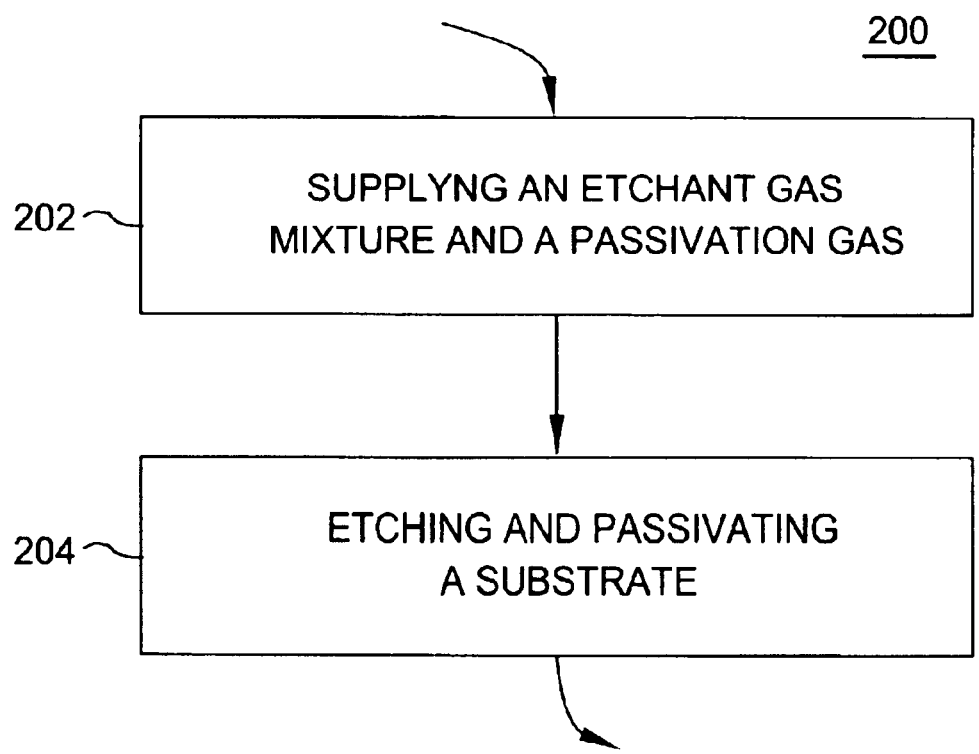
FIG. 2 depicts a flow diagram of an example of embodiment of a one-step inventive method.

FIG. 2 is a flow diagram of an example of a method 200 for etching high K dielectric materials such as a hafnium dioxide using a one-step etch process. In one embodiment of the invention, the hafnium dioxide layer forms a dielectric in the gate structure of a transistor.

The method 200 begins, at step 202, by supplying an etchant gas mixture and a passivation gas to a reaction chamber. When etching a dielectric material such as hafnium dioxide, the passivation gas is nitrogen and the etchant gas mixture comprises, for example, a halogen gas such as $Cl_2$ and a reducing gas such as CO. Then, at step 204, the method 200 forms a plasma comprising the etchant and passivation gases and simultaneously etches and passivates the hafnium dioxide and the exposed silicon. Step 204 has a duration that continues until an unmasked portion of the dielectric layer is removed and passivation is complete. For a gate structure comprising hafnium dioxide and polysilicon, the $HfO_2$ is passivated by forming $HfO_2N$ and the silicon is passivated by forming SiN. In an alternative embodiment, the passivation gas may be supplied during only a portion of the etch process. As such, the passivation gas would be added to the chamber at the end of the etch process when the dielectric is nearly all removed. In a further embodiment of the invention, the plasma etching step 204 may comprise a main etch process and an overetch process, where the process parameters may change during each process to optimize the etching results. When step 204 uses the main and overetch processes, the passivation gas may be supplied during the overetch process.

In one specific embodiment of the invention, the gas mixture (etchant and passivation gases) is supplied to the etch process chamber 110 at a flow rate in the range of 20–300 sccm $Cl_2$, 2–200 sccm CO, and 20–200 sccm $N_2$. Such flow rates define a flow ratio of $Cl_2$ to CO to $N_2$ in the range of (0.1–1):(1–0.1):(0.1–1). The total pressure of the gas mixture in the chamber 110 is regulated to be maintained in the range of 2–100 mTorr and the wafer 114 is heated to 100–500 degrees Celsius. Etching of the wafer 114 occurs in step 204. Once the gas mixture is present above the wafer 114, step 204 applies 200–2500 Watts of RF power to the antenna 112 to form the plasma 152 and applies 5–300 Watts of a pedestal bias power. One specific process recipe for etching hafnium dioxide uses an antenna power of 1100 Watts, a pedestal bias power of 20 Watts, the ratio of flow rates of $Cl_2$.$CO$:$N_2$ is 1:1:1, (e.g., 40 sccm of $Cl_2$, 40 sccm of CO, 40 sccm of $N_2$), a chamber pressure of 4 mTorr, and a pedestal temperature of 350° C.

Figure 3:
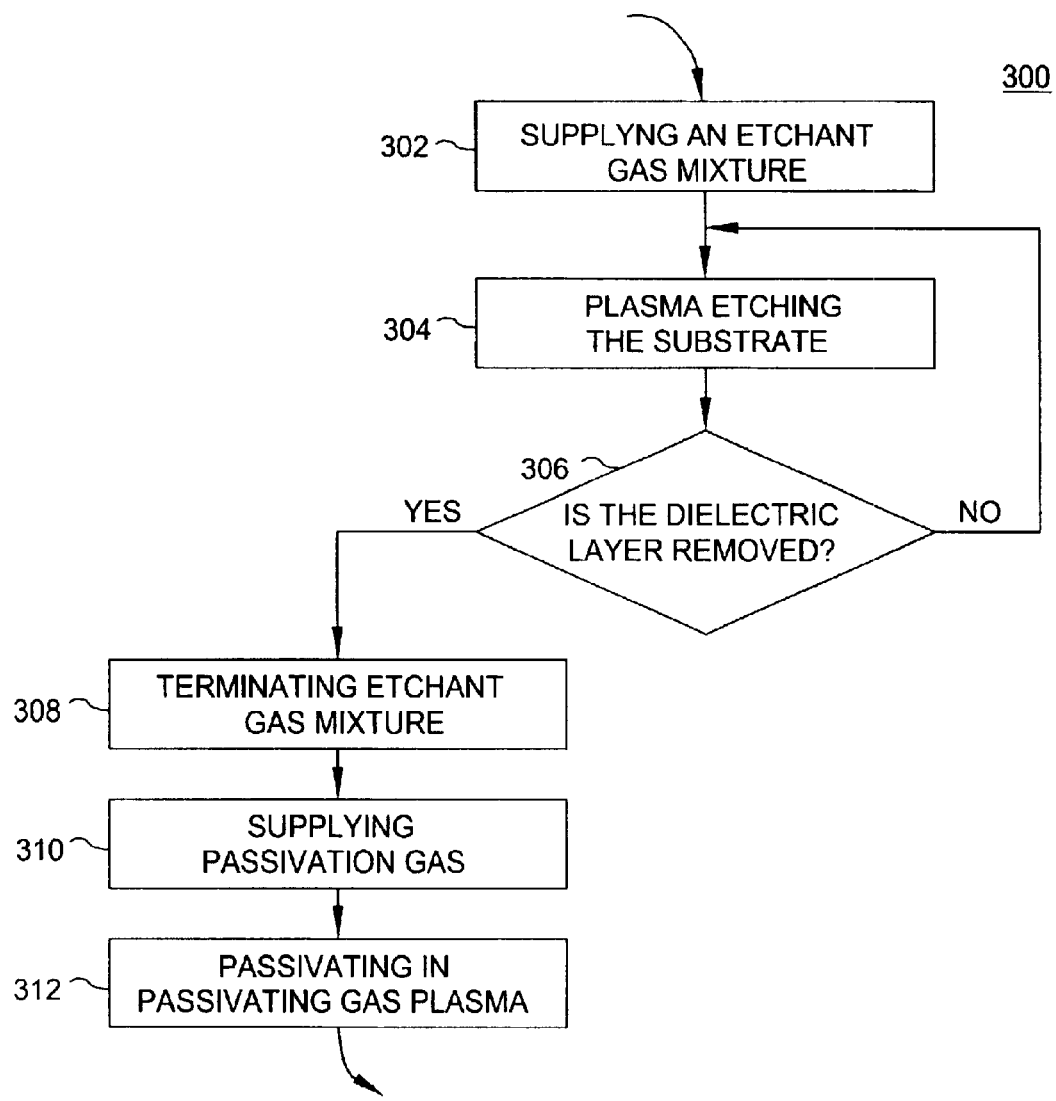
FIG. 3 depicts a flow diagram of an example of embodiment of a two-step inventive method.

FIG. 3 is a flow diagram of an example of a method 300 for etching high K dielectric materials such as a hafnium dioxide using a two-step etch process. In one specific embodiment, the hafnium dioxide layer forms a dielectric in the gate structure of a transistor.

The method 300 begins, at step 302, by supplying an etchant gas mixture. When etching a dielectric material such as hafnium dioxide, the gas mixture comprises a halogen gas such as $Cl_2$ and a reducing gas such as CO. At step 304, the gas mixture is energized to form a plasma and the substrate is etched to remove the dielectric material that is exposed to the etchant gas plasma. The etching step 304 may have a duration that continues until an unmasked portion of hafnium dioxide is either completely or mostly removed. At step 306, the method queries whether the $HfO_2$ layer is completely removed after step 304. If the query is affirmatively answered, the process proceeds to step 308. If the query is negatively answered, the process proceeds to step 304 for further etching. The plasma etching step 304 may comprise a main etch process and an overetch process, where the process parameters may change during each process to optimize the etching results. When step 304 uses the main and overetch processes, the passivation gas may be supplied during the overetch process.

Once the dielectric material is removed, the method 300 proceeds to step 308. At step 308, the etchant gas mixture is terminated. At step 310, the passivating gas (for example, $N_2$) is supplied to the reaction chamber. Energy is supplied to the passivation gas to form a passivation gas plasma. The passivation gas plasma will passivate the exposed silicon and the exposed dielectric material. For example, in a gate structure using a polysilicon electrode, a hafnium dioxide dielectric layer, and a silicon substrate, the passivation gas is nitrogen. The nitrogen plasma forms a silicon nitride layer at the surface of the exposed silicon and polysilicon and forms an $HfO_2N$ layer at the surface of the hafnium dioxide layer. These thin nitride layers protect the underlying material from oxidation during subsequent substrate processing, e.g., post etch cleaning in an oxygen plasma.

The process time in steps 204, 304, and 312 is terminated upon a certain optical emission occurring, upon a particular duration occurring, or upon some other indicator determining that the dielectric layer has been removed and the passivation is complete. In general, steps 310 and 312 may be performed either in-situ in a plasma etch reactor or in a separate plasma reactor that is adapted to the passivation gas plasma. In an exemplary embodiment, when steps 310 and 312 are performed in the separate plasma reactor, it is preferred that a wafer does not leave a vacuumized environment between steps 308 and 310.

In an exemplary embodiment when steps 310 and 312 are performed in-situ, supplying the etchant gas mixture may be either terminated in step 308 as depicted in FIG. 3 or, optionally, the gas mixture may be gradually replaced with the passivation gas during steps 308, 310. In the latter embodiment, the etchant plasma does not extinguish after step 308 and gradually transforms into the passivation plasma.

The foregoing steps in the methods 200 and 300 need not be performed sequentially. For example, some or all of the steps may be performed simultaneously to etch and passivate the substrate.

In one specific embodiment of the invention, the etchant gas mixture is supplied in step 302 at a flow rate in the range of 20–300 sccm $Cl_2$ and 2–200 sccm CO to the etch process chamber 110. The total pressure of the gas mixture in the chamber 110 is regulated to be maintained in the range of 2–100 mTorr and the wafer 114 is heated to 100–500 degrees Celsius. Etching of the wafer 114 occurs in step 304. Once the gas mixture is present above the wafer 114, step 304 applies 200–2500 Watts of RF power to the antenna 112 to form the plasma 152 and applies 0–300 Watts of a pedestal bias power. One specific process recipe for etching hafnium dioxide uses an antenna power of 1100 Watts, a pedestal bias power of 20 Watts, 40 sccm of $Cl_2$, 40 sccm of CO, a chamber pressure of 4 mTorr, and a pedestal temperature of 350° C. Passivation is performed at step 310/312 by supplying $N_2$ at a rate of 20–200 sccm while applying 200–2500 Watts of antenna power. During passivation, the pedestal bias power is 0–300 Watts, the chamber pressure is 10–50 mTorr, and a pedestal temperature is 100–500 degrees Celsius. One specific process recipe for passivation after etching hafnium dioxide, uses an antenna power of 1100 Watts, a pedestal bias power of 20 Watts, 40 sccm $N_2$, a chamber pressure of 4 mTorr, and a pedestal temperature of 350° C.

Figure 4B:
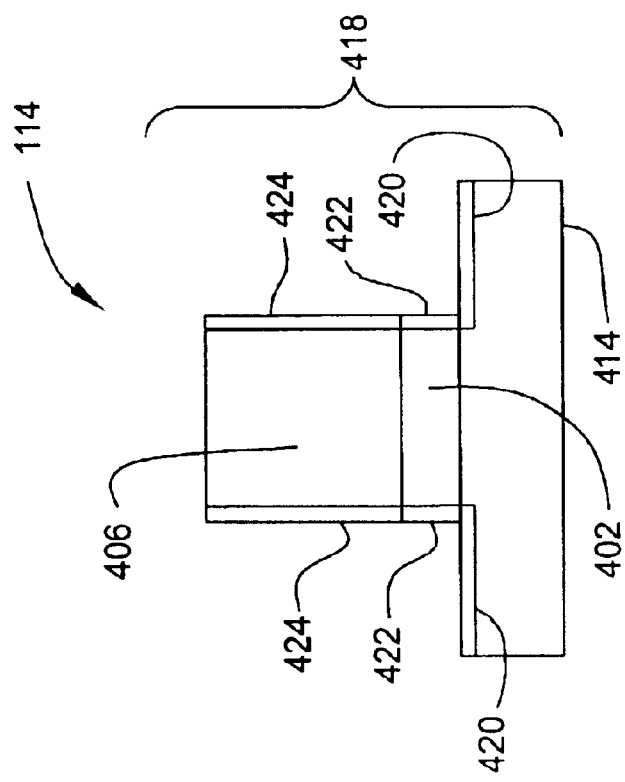
FIG. 4b depicts a schematic cross-sectional view of a gate structure comprising the hafnium dioxide layer of FIG. 4a that has been etched using an etching chemistry according to an example of the present invention.
Figure 4A:
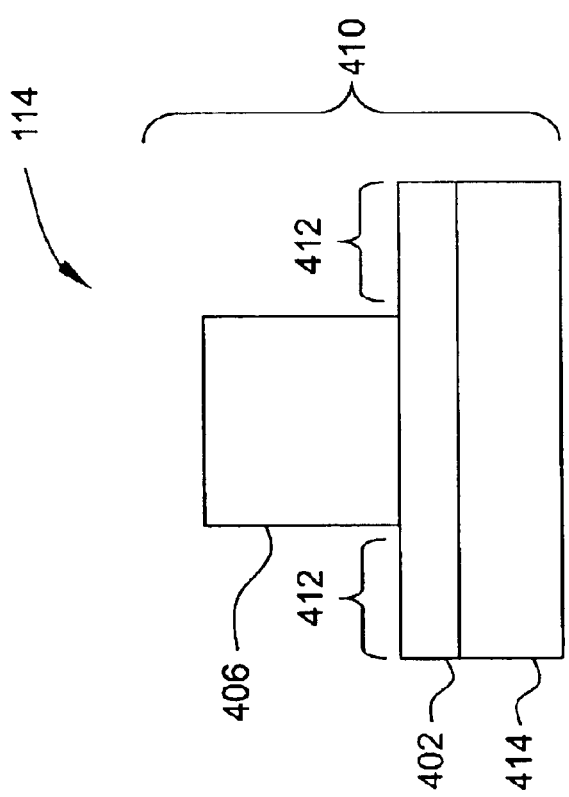
FIG. 4a depicts a schematic cross-sectional view of a wafer having a hafnium dioxide layer of the kind used in performing the etching process according to an example of the present invention.

One illustrative embodiment of the inventive process is used for etching a wafer 114 containing a film stack 410 of FIG. 4a to form a gate structure of a transistor. The film stack 410 comprises a doped silicon substrate 414, a high K dielectric layer 402, and a polysilicon electrode 406. The polysilicon electrode 406 has been previously etched to a form defined by a patterned etch mask that has been previously removed. The electrode 406 is patterned to function as a hard mask to leave a portion 412 of the high K dielectric layer 402 exposed to the etch chemistry. The channel, source, and drain regions of a transistor are formed in the doped silicon substrate 414. The high K dielectric layer 402 can be made very thin, e.g., about 5 nm or less. Alternatively, a thin $SiO_2$ layer (e.g., 1–2 nm) may reside between the high K dielectric layer 402 and the doped silicon substrate 414.

The result of the inventive etching method is best appreciated by referring to a gate structure depicted in FIG. 4b. The profile illustrates a wafer 114 having a gate stack 418. The gate stack 418 comprises the high K dielectric layer 402, the doped silicon substrate 414, the polysilicon electrode 406, and passivated regions 420, 422 and 424. The thin passivated regions 420, 422, and 424 are formed over the layers 414, 402 and 406, respectively. The nitrided surfaces block oxygen from oxidizing the polysilicon electrode, gate dielectric, and underlying silicon during the post-etch processing, e.g., removing etch residue using an oxygen plasma cleaning process.

The invention may be practiced in other etching equipment wherein the processing parameters may be adjusted to achieve acceptable etch characteristics by those skilled in the arts by utilizing the teachings disclosed herein without departing from the spirit of the invention.

While foregoing is directed to the preferred embodiment of the present invention, other and further embodiments of the invention may be devised without departing from the basic scope thereof, and the scope thereof is determined by the claims that follow.

What is claimed is:

1. A method of etching a substrate comprising a dielectric material having a dielectric constant that is greater than 4, comprising:

exposing the dieiectric material to a first plasma comprising a reducing gas and a halogen containing gas to etch said dielectric material; and a second plasma comprising a passivating gas passivate the exposed dielectric material.

2. The method of claim 1 wherein the dielectric material is at least one of $HfO_2$, $ZrO_2$, $Al_2O_3$, BST, PZT, $ZrSiO_2$, $HfSiO_2$, HfSiON, or a $TaO_2$.

3. The method of claim 1 wherein the dielectric material is $HfO_2$.

4. The method of claim 3 further comprising the step of:

maintaining the substrate at a temperature between 100 to 500 degrees Celsius.

5. The method of claim 1 wherein the exposing step comprises exposing the substrate to the first and second plasma simultaneously.

6. The method of claim 1 wherein the exposing step comprises:

exposing the substrate to the first and second plasma sequentially.

7. The method of claim 1 wherein the halogen containing gas comprises a chlorine containing gas, the reducing gas comprises carbon monoxide, and the passivating gas comprises nitrogen.

8. The method of claim 7 wherein the chlorine containing gas is $Cl_2$, the reducing gas is CO, and the passivating gas is $N_2$ or a mixture of $N_2$ with an inert gas such as He.

9. The method of claim 8 wherein the exposing step further comprises the step of:

supplying between 20 to 300 sccm of $Cl_2$;
supplying between 2 to 200 sccm of $Cl_2$;
supplying between 20 to 200 sccm of $N_2$.

10. The method of claim 8 further comprising the step of:

maintaining a pressure of between 2–100 mTorr.

11. A method for etching a workpiece having a layer of hafnium dioxide comprising the steps of:

supplying between 20 to 300 sccm of $Cl_2$, between 2 to 200 sccm of CO, and between 20 to 200 sccm of $N_2$;

maintaining a pressure of between 2–100 mTorr;

applying a bias power to a cathode electrode of between 0 to 300 W;

applying power to an inductively coupled antenna of between 200 to 2500 W; and maintaining the workpiece at a temperature between 100 and 500 degrees Celsius; and thereby etching and passivating the hafnium dioxide layer.

12. A method for etching a workpiece having a layer of hafnium dioxide using the steps of etching and passivating, the method comprising:

during the etching step of the hafnium dioxide layer, supplying between 20 to 300 sccm of $Cl_2$, between 2 to 200 sccm of CO, maintaining a pressure of between 2–100 mTorr, applying a bias power to a cathode electrode of between 5 to 300 W, and applying power to an inductively coupled antenna of between 200 to 2500 W;

during the passivating step of the etched hafnium dioxide layer, supplying between 20 to 200 sccm of $N_2$, maintaining a pressure of between 2–50 mTorr, applying a bias power to a cathode electrode of between 0 to 300 W, and applying power to an inductively coupled antenna of between 200 to 2500 W; and maintaining the workpiece at a temperature between 100 and 500 degrees Celsius.

* * * * *

UNITED STATES PATENT AND TRADEMARK OFFICE
CERTIFICATE OF CORRECTION

PATENT NO. : 6,902,681 B2
DATED : June 7, 2005
INVENTOR(S) : Nallan et al.

It is certified that error appears in the above-identified patent and that said Letters Patent is hereby corrected as shown below:

Title page,
Item [76], Inventors, delete "90486" and insert -- 94086 --.

Column 5,
Line 13, delete "$Cl_2.CO:N_2$" and insert -- $Cl_2:CO:N_2$ --.

Column 7,
Line 10, delete "dieiectric" and insert -- dielectric --.
Line 12, after "material" delete ";".
Line 13, after "gas" insert -- to --.
Line 17, after "or" delete "a".

Signed and Sealed this

Third Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,902,681 B2
APPLICATION NO. : 10/184301
DATED : June 7, 2005
INVENTOR(S) : Nallan et al.

It is certified that error appears in the above-identified patent and that said Letters Patent is hereby corrected as shown below:

<u>Title page,</u>
Item [73], insert -- Assignee, Applied Materials, Inc. Santa Clara, CA (US). --.

Signed and Sealed this

Fourth Day of July, 2006

JON W. DUDAS
*Director of the United States Patent and Trademark Office*